United States Patent
Kuenemund et al.

(10) Patent No.: US 9,432,014 B2
(45) Date of Patent: Aug. 30, 2016

(54) CIRCUIT ARRANGEMENT FOR PREVENTING HIGH CURRENT FLOW DURING ENERGY-SAVING MODE

(71) Applicant: Infineon Technologies AG, Neubiberg (DE)

(72) Inventors: Thomas Kuenemund, Munich (DE); Artur Wroblewski, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 70 days.

(21) Appl. No.: 13/956,445

(22) Filed: Aug. 1, 2013

(65) Prior Publication Data

US 2015/0035572 A1   Feb. 5, 2015

(30) Foreign Application Priority Data

Aug. 1, 2012  (DE) .................. 10 2012 107 028

(51) Int. Cl.
*H03K 17/22* (2006.01)
*G06F 1/26* (2006.01)
*G06F 1/32* (2006.01)

(52) U.S. Cl.
CPC ............ *H03K 17/223* (2013.01); *G06F 1/263* (2013.01); *G06F 1/3296* (2013.01); *Y02B 60/1285* (2013.01)

(58) Field of Classification Search
CPC ..................... H03K 17/223; H03K 19/00315; G05F 1/465; G11C 5/148
USPC ....... 327/546, 530, 534, 535, 538, 540, 541, 327/543, 544, 545
See application file for complete search history.

(56) References Cited

U.S. PATENT DOCUMENTS

| | | | | |
|---|---|---|---|---|
| 5,583,457 A | * | 12/1996 | Horiguchi et al. | 326/121 |
| 5,801,576 A | * | 9/1998 | Ooishi | 327/530 |
| 6,107,700 A | * | 8/2000 | Ishikawa et al. | 307/116 |
| 6,292,015 B1 | * | 9/2001 | Ooishi et al. | 326/33 |

(Continued)

FOREIGN PATENT DOCUMENTS

| | | |
|---|---|---|
| CN | 1976228 A | 6/2007 |
| CN | 101606319 A | 12/2009 |

(Continued)

OTHER PUBLICATIONS

English Abstract of DE 10116871 A1, dated Nov. 7, 2002.

(Continued)

*Primary Examiner* — Jung Kim

(57) ABSTRACT

In accordance with one embodiment, a circuit arrangement is provided including a circuit having a first terminal for a first supply potential and a second terminal for a second supply potential, wherein the first terminal is coupled to the first supply potential; a switch, by means of which the second terminal can be coupled to the second supply potential; a voltage source coupled to the second terminal; and a control device designed to open the switch in reaction to receiving a turn-off signal in an operating mode in which the switch is closed, and subsequently to control the voltage source in such a way that it varies the potential of the second terminal in the direction of the first supply potential.

15 Claims, 8 Drawing Sheets

(56) References Cited

U.S. PATENT DOCUMENTS

| | | | |
|---|---|---|---|
| 7,276,956 B2* | 10/2007 | Furuta et al. | 327/534 |
| 7,675,347 B2* | 3/2010 | Teramoto et al. | 327/534 |
| 7,786,793 B2 | 8/2010 | Ogata | |
| 7,936,205 B2* | 5/2011 | Kong et al. | 327/534 |
| 8,004,351 B2 | 8/2011 | Ikenaga et al. | |
| 2001/0004218 A1 | 6/2001 | Horiguchi et al. | |
| 2001/0040834 A1 | 11/2001 | Ooishi | |
| 2001/0052792 A1 | 12/2001 | Ooishi et al. | |
| 2006/0061419 A1 | 3/2006 | Edwards | |
| 2007/0165343 A1 | 7/2007 | Barowski et al. | |
| 2010/0327961 A1 | 12/2010 | Ikenaga et al. | |
| 2013/0113286 A1* | 5/2013 | Farrenkopf | H02M 3/1582 307/43 |

FOREIGN PATENT DOCUMENTS

| | | |
|---|---|---|
| CN | 102354259 A | 2/2012 |
| CN | 102427296 A | 4/2012 |
| DE | 19515417 C2 | 10/1998 |
| DE | 10116871 A1 | 11/2002 |
| WO | 2005067144 A1 | 7/2005 |

OTHER PUBLICATIONS

Shi et al. "Optimization of stand-by power in deep sub-micro integrated circuit", Microcomputer Information, Sep. 10, 2005, 4 pages, vol. 21, No. 12-2.

* cited by examiner

CIRCUIT ARRANGEMENT FOR PREVENTING HIGH CURRENT FLOW DURING ENERGY-SAVING MODE

CROSS-REFERENCE TO RELATED APPLICATION

This application claims priority to German Patent Application Serial No. 10 2012 107 028.8, which was filed Aug. 1, 2012, and is incorporated herein by reference in its entirety.

TECHNICAL FIELD

Various embodiments relate generally to circuit arrangements, for example integrated circuits.

BACKGROUND

In an integrated circuit it may be desirable, depending on the application, for the integrated circuit to have an energy-saving mode. Besides the requirement that as much energy as possible is intended to be saved with such an energy-saving mode, other requirements may also be made of an energy-saving mode, such as, for example, a rapid return from the energy-saving mode to normal operation, for example normal data processing operation, a rapid entry to the energy-saving mode and a low current consumption during the transitions to the energy-saving mode and back to normal operation. It is desirable to provide circuits which meet such requirements.

SUMMARY

In accordance with one embodiment, a circuit arrangement is provided including a circuit having a first terminal for a first supply potential and a second terminal for a second supply potential, wherein the first terminal is coupled to the first supply potential; a switch, by means of which the second terminal can be coupled to the second supply potential; a voltage source coupled to the second terminal; and a control device designed to open the switch in reaction to receiving a turn-off signal in an operating mode in which the switch is closed, and subsequently to control the voltage source in such a way that it varies the potential of the second terminal in the direction of the first supply potential.

In accordance with another embodiment, a circuit arrangement is provided including a circuit having a first terminal for a first supply potential and a second terminal for a second supply potential, wherein the first terminal is coupled to the first supply potential; a switch, by means of which the second terminal can be coupled to the second supply potential; a voltage source coupled to the second terminal; and a control device designed, in reaction to receiving a turn-on signal in an operating mode in which the switch is open, to control the voltage source in such a way that it varies the potential of the second terminal in the direction of the second supply potential, and subsequently to close the switch.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
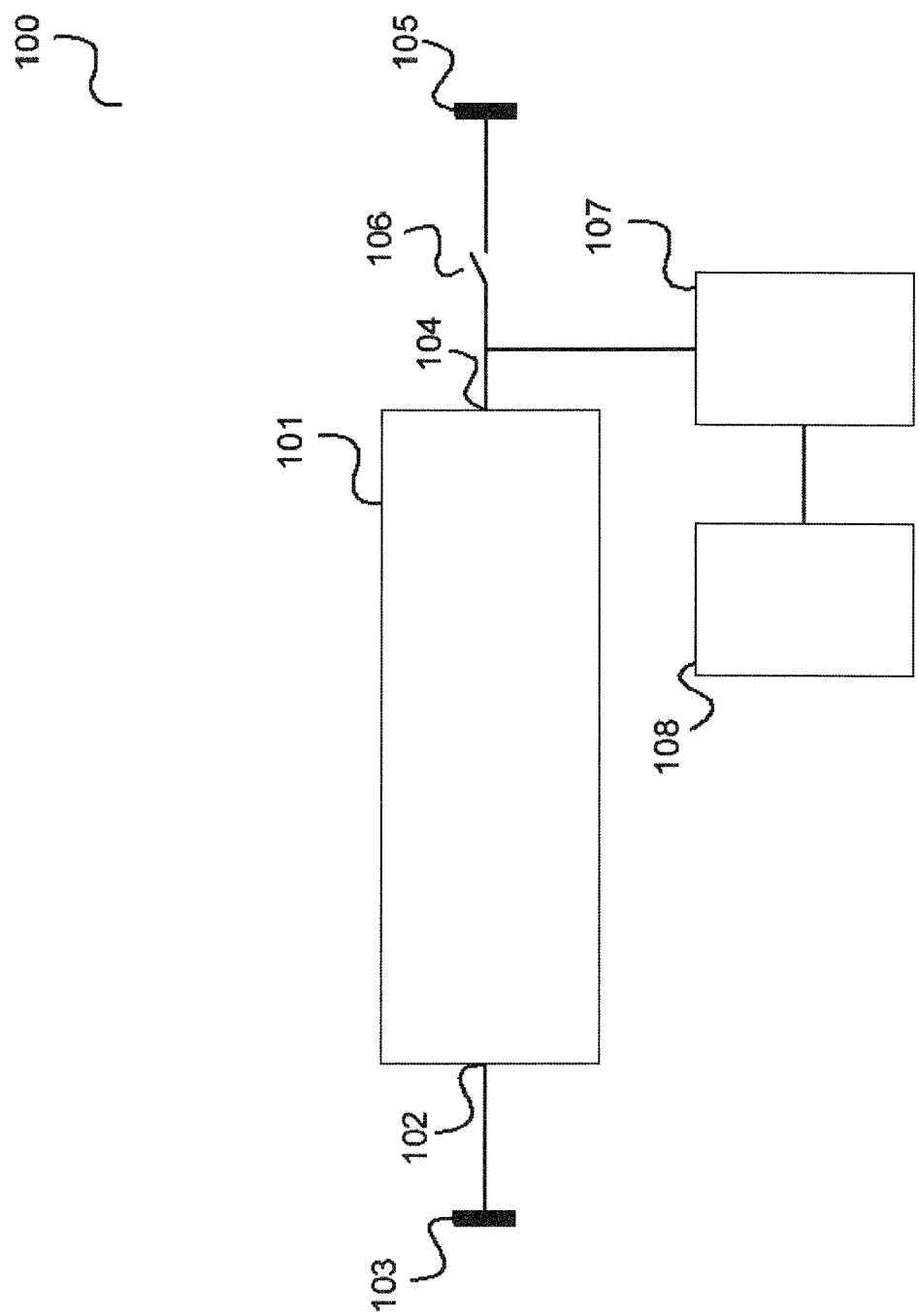
FIG. 1 shows a circuit arrangement in accordance with one embodiment.

The following detailed description relates to the accompanying figures, which show details and exemplary embodiments. These exemplary embodiments are described in sufficient detail to enable the person skilled in the art to implement the invention. Other embodiments are also possible and the exemplary embodiments can be modified in a structural, logical and electrical regard, without departing from the subject matter of the invention. The different exemplary embodiments are not necessarily mutually exclusive, rather different embodiments can be combined with one another, thus giving rise to new embodiments.

An integrated (semiconductor) circuit (IC (Integrated Circuit)), such as is used on a smart card, for example, may have an energy-saving mode such as, for example, a data retention mode, a sleep mode or a standby mode, in or with which the "normal" data processing mode can be interrupted, wherein, as a first requirement, in the energy-saving mode typically only a very low static quiescent current is permitted to be consumed by the circuit.

A second requirement typically consists in the fact that the circuit is intended to be able to resume data processing after the return from the energy-saving mode to the data processing mode promptly (i.e. after only a short delay).

These two requirements above typically apply very generally to integrated circuits having an energy-saving mode (such as sleep mode or standby mode).

Before the change from the data processing mode to the energy-saving mode, the information stored in data path registers and switching mechanism registers, for example, is maintained by the data contents of all these registers being transferred into other memory circuits (such as a register bank or SRAM (Static Random-Access Memory) integrated in the integrated circuit), regarding which it can be assumed that they remain connected to the supply voltage. Upon resumption of the data processing mode, this information is then transferred back again into the respective data path and switching mechanism registers. However, the use of such a procedure typically leads to additional circuit outlay and (above all) to a considerable expenditure of time and increase in complexity.

It is also possible to use specially designed data retention flip-flops which contain per stored bit an additional flip-flop having a low leakage current (Low-Leakage Latch (LLL)), into which the information stored in the flip-flop is transferred before entry to the energy-saving mode and from which the flip-flop reacquires the information before reentry to the data processing mode. It is thus possible to disconnect the flip-flop itself from the supply voltage in the energy-saving mode and to supply only the additional flip-flop with energy, wherein care can be taken to ensure that the additional flip-flop has only little leakage current, since it is relevant only in the energy-saving mode and therefore does not have to meet any speed requirements with regard to the data processing speed. However, this procedure typically leads to a considerable increase in area and thus costs for the implementation of the additional flip-flops.

A third requirement for the energy-saving mode may consist in the fact that the circuit, after the transition from the data processing mode to the energy-saving mode, is intended to have a very much lower static quiescent current compared with the data processing mode within a very short period of time.

This can be fulfilled, for example, by the fact that, with relatively low requirements in respect of the computing speed and the consequently relatively low system frequencies for the circuit implementation, it is possible to use CMOS technologies having a high threshold voltage (hVth) which also results in a relatively low static quiescent current (the dominant portion of which consists in the so-called channel leakage current through turned-off nMOS or pMOS transistors, said current being exponentially dependent on the threshold voltage). For future contactless (smart card) systems, however, significantly heightened requirements in respect of the computing speed are applicable, which also necessitate the use of CMOS technologies with lower threshold voltages (regular threshold voltage rVth). This in turn results in a significantly increased static current consumption, which makes it necessary for the first two requirements described above to be met.

A fourth requirement may consist in the fact that the circuit is intended to have in each case a very low (quasi-static) current consumption (e.g. below the milliamperes range) during the transition from the data processing mode to the energy-saving mode and during the transition from the energy-saving mode back to the data processing mode again.

The third requirement and the fourth requirement may be very important for example for contactless systems (e.g. contactless smart cards) since malfunctions of the system can result if said requirements are not met. If the third requirement is not met, for example, then this can have the effect that the supply voltage of the system falls below the level required for the correct function of the system during an interruption (lasting a few microseconds) of the (wireless) radio energy supply. Such an interruption of the energy supply must be reckoned with, for example, during a so-called type A communication of a contactless system. If the fourth requirement is not met, i.e. if an excessively high current flows during an operating mode transition, then this can lead to an erroneous interpretation of the field modulation caused by excessively high current consumption as useful information (for example by a smart card reader).

In accordance with one embodiment, the first two requirements are met by (the largest possible) portions of the switching networks and switching mechanisms (that is to say of the combinatorial and sequential logic) integrated in a circuit being disconnected at high impedance in a switchable manner from the supply voltage (that is to say from the positive (i.e. high) supply potential VDD and/or from the negative (i.e. low) supply potential VSS (e.g. from ground)). In this case, at least some of the information stored in the switching mechanism registers of the circuit is maintained there (i.e. in the registers of the circuit) by virtue of a sufficient number of the registers remaining connected to the supply voltage in the energy-saving mode as well. These registers are suitably electrically insulated from those parts of the circuit which are disconnected from the supply voltage, since otherwise undesirable and uncontrollable shunt currents would flow through the input interfaces of these registers.

Figure 2:
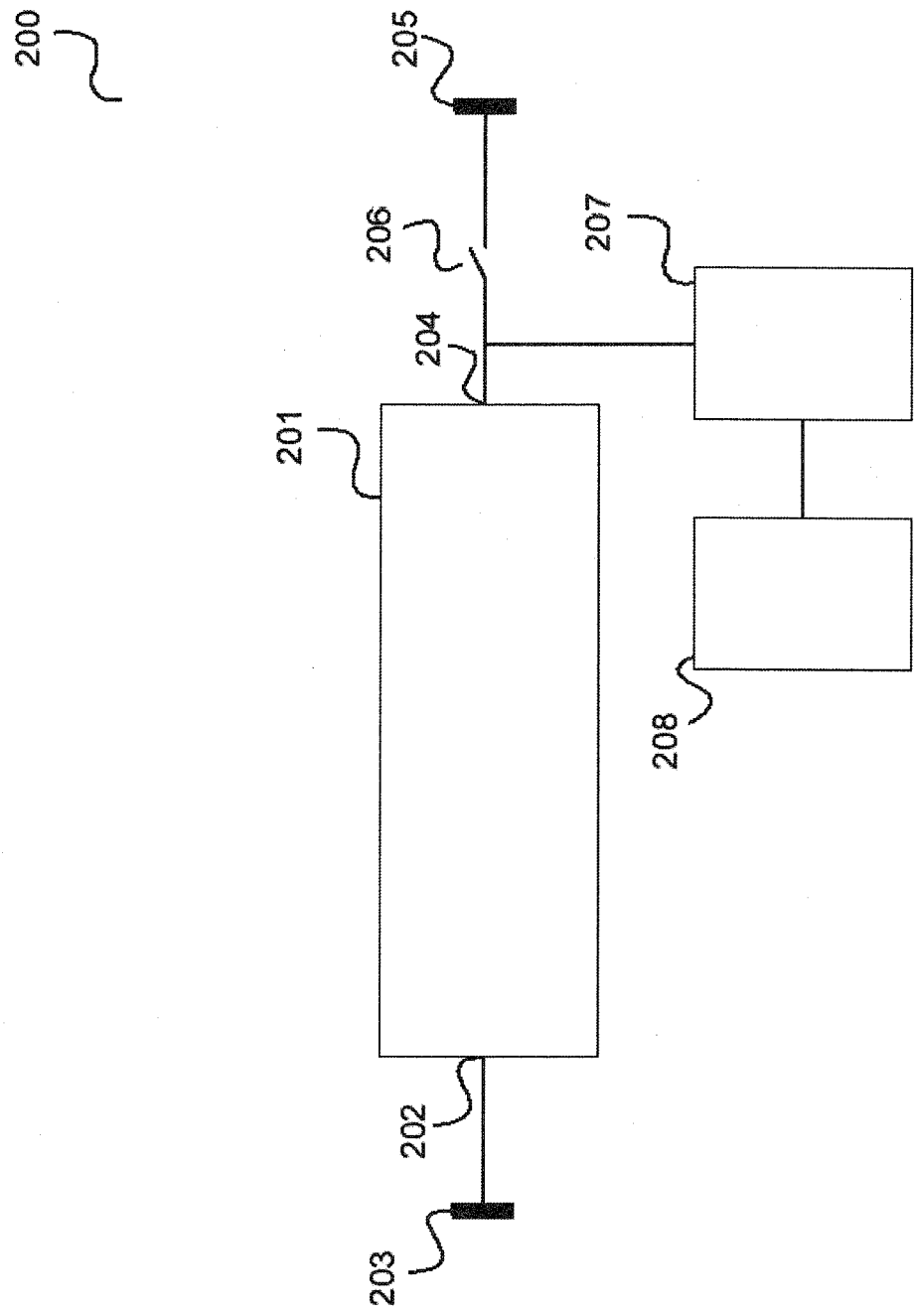
FIG. 2 shows a circuit arrangement in accordance with one embodiment.

In accordance with one embodiment, the third requirement and the fourth requirement are met on the basis of circuit arrangements such as are illustrated in FIG. 1 and FIG. 2.

FIG. 1 shows a circuit arrangement 100 in accordance with one embodiment.

The circuit arrangement 100 includes a circuit 101 having a first terminal 102 for a first supply potential 103 and a second terminal 104 for a second supply potential 105, wherein the first terminal 102 is coupled to the first supply potential 103.

The circuit arrangement 100 furthermore includes a switch 106, by means of which the second terminal 104 can be coupled to the second supply potential 105.

Furthermore, the circuit arrangement includes a voltage source 107 coupled to the second terminal 104, and a control device 108 designed to open the switch (e.g. in order to enter an energy-saving mode) in reaction to receiving a turn-off signal in an operating mode in which the switch 106 is closed (e.g. in a normal operating mode, e.g. a data processing mode), and subsequently to control the voltage source 107 in such a way that it varies the potential of the second terminal 104 in the direction of the first supply potential 103.

In other words, if a circuit (which can be part of a larger overall circuit) is intended to be turned off, i.e. for example is intended to undergo transition to an energy-saving mode and for this purpose e.g. is intended not to be supplied with energy, a supply potential terminal (the second terminal in FIG. 1) of the circuit is disconnected from the corresponding supply potential (i.e. the supply potential provided for this supply potential terminal) and the supply potential terminal is charged to (or at least in the direction of) the opposite supply potential. This makes it possible to reduce or even avoid leakage currents from the opposite supply potential through the circuit to the supply potential terminal.

The third requirement described above can thus be met by the voltage source being controlled in such a way that it brings the second terminal to a desired-value potential value within a predefined period of time.

Furthermore, as a result of the charging of the supply potential terminal in the direction of the opposite supply potential, illustratively the charge that in this case initially flowed into the circuit can later flow away again from the circuit, such that said charge is available for other circuit parts which still have to be supplied with energy for example during the energy-saving mode. In this sense, the circuit may be regarded as a charge buffer for other circuit parts.

In one embodiment, the first supply potential is a high supply potential and the second supply potential is a low supply potential. Illustratively, in this embodiment, the low supply potential is decoupled in the energy-saving mode.

The circuit includes for example a plurality of n-channel field effect transistors, the source terminals of which are coupled to the second terminal.

The substrate terminals of the n-channel field effect transistors are coupled to the second supply potential for example.

The voltage source can vary the potential of the second terminal in the direction of the first supply potential by feeding current to the second terminal, and the control device controls the voltage source for example in such a way that the current fed to the second terminal by the voltage source does not exceed a predefined maximum value.

The voltage source may vary the potential of the second terminal in the direction of the first supply potential by feeding to the second terminal current in addition to the total current which flows from the first supply potential through the circuit to the second terminal.

In accordance with one embodiment, the voltage source is designed to feed to the second terminal current which is greater than the total current which flows from the first supply potential through the circuit to the second terminal.

In accordance with one embodiment, the first supply potential is a low supply potential and the second supply potential is a high supply potential. Illustratively, in this embodiment, the high supply potential is decoupled in the energy-saving mode.

By way of example, the circuit has a plurality of p-channel field effect transistors, the source terminals of which are coupled to the second terminal.

By way of example, the substrate terminals of the p-channel field effect transistors are coupled to the second supply potential.

The voltage source may vary the potential of the second terminal in the direction of the first supply potential by carrying away current from the second terminal, and the control device can control the voltage source in such a way that the current carried away from the second terminal by the voltage source does not exceed a predefined maximum value.

The voltage source may vary the potential of the second terminal in the direction of the first supply potential by carrying away from the second terminal current in addition to the total current which flows from the second terminal through the circuit to the first supply potential.

By way of example, the voltage source is designed to carry away from the second terminal current which is greater than the total current which flows from the second terminal through the circuit to the first supply potential.

The circuit is a smart card circuit, for example.

The circuit implements a memory and/or arithmetic unit, for example.

FIG. 2 shows a circuit arrangement 200 in accordance with one embodiment.

The circuit arrangement 200 includes a circuit 201 having a first terminal 202 for a first supply potential 203 and a second terminal 204 for a second supply potential 205, wherein the first terminal 202 is coupled to the first supply potential 203.

The circuit arrangement furthermore includes a switch 206, by means of which the second terminal can be coupled to the second supply potential 205.

Furthermore, the circuit arrangement 200 includes a voltage source 207 coupled to the second terminal 204, and a control device 208 designed, in reaction to receiving a turn-on signal in an operating mode in which the switch 206 is open (e.g. in an energy-saving mode), to control the voltage source 207 in such a way that it varies the potential of the second terminal 204 in the direction of the second supply potential 205, and subsequently to close the switch 206 (e.g. in order to enter a normal operating mode, e.g. a data processing mode).

In other words, if a circuit (which can be part of a larger overall circuit) which is turned off, i.e. for example is in an energy-saving mode and for this purpose is intended e.g. not to be supplied with energy, and in which therefore a supply potential terminal (the second terminal in FIG. 1) of the circuit is disconnected from the corresponding supply potential (i.e. the supply potential provided for this supply potential terminal) is intended to be turned on again, the supply potential terminal is charged to (or at least in the direction of) the supply potential before the supply potential terminal is connected to the corresponding supply potential. This makes it possible to prevent an excessively high current from flowing between supply potential terminal and supply potential during the connection of the supply potential terminal to the supply potential (see the fourth requirement described above).

In accordance with one embodiment, the first supply potential is a high supply potential and the second supply potential is a low supply potential. Illustratively, in this embodiment, the low supply potential is decoupled in the energy-saving mode.

The voltage source can vary the potential of the second terminal in the direction of the second supply potential by carrying away current from the second terminal, and the control device can control the voltage source in such a way that the current carried away from the second terminal by the voltage source does not exceed a predefined maximum value.

In accordance with one embodiment, the first supply potential is a low supply potential and the second supply potential is a high supply potential. Illustratively, in this embodiment, the high supply potential is decoupled in the energy-saving mode.

The voltage source may vary the potential of the second terminal in the direction of the second supply potential by feeding current to the second terminal, and the control device can control the voltage source in such a way that the current fed to the second terminal by the voltage source does not exceed a predefined maximum value.

Embodiments described in connection with the circuit arrangement 100 analogously apply to the circuit arrangement 200, and vice versa.

In the circuit arrangement 100 and the circuit arrangement 200, the function of the switch can be understood such that, if the switch is open, the second terminal is decoupled from the second supply potential and, if the switch is closed, the second terminal is coupled to the second supply potential. Coupled may be understood to mean in this context, inter alia, electrically conductively connected or electrically coupled.

The turn-off signal and the turn-on signal are transmitted to the control device for example from a further control device, e.g. from a control processor.

The voltage source 107, 207 is coupled to the second terminal 104, 204 for example directly, i.e. not via the circuit 101, 201. In other words, the second terminal 104, 204 may be regarded as a node at which three current branches (or line branches) meet (or are combined): one branch leading to the circuit 101, 201, one branch leading to the voltage source 107, 207, and one branch leading to the switch 106, 206. The control device 108, 208 and the voltage source 107, 207 belong, for example, to part of the circuit arrangement 100, 200 which is not put into the energy-saving mode, i.e. which continues to be supplied with energy, even when the circuit 101, 102 is put into the energy-saving mode.

In accordance with one embodiment, the circuit arrangement 100 and the circuit arrangement 200 can be combined, e.g. the control device can have both the function described in connection with the circuit arrangement 100 and the function described in connection with the circuit arrangement 200.

An embodiment is described below in which the circuit arrangements 100 and 200 are combined in this sense and in which the circuit is part of an overall circuit which is part of an integrated circuit arranged on a smart card, for example.

Figure 3:
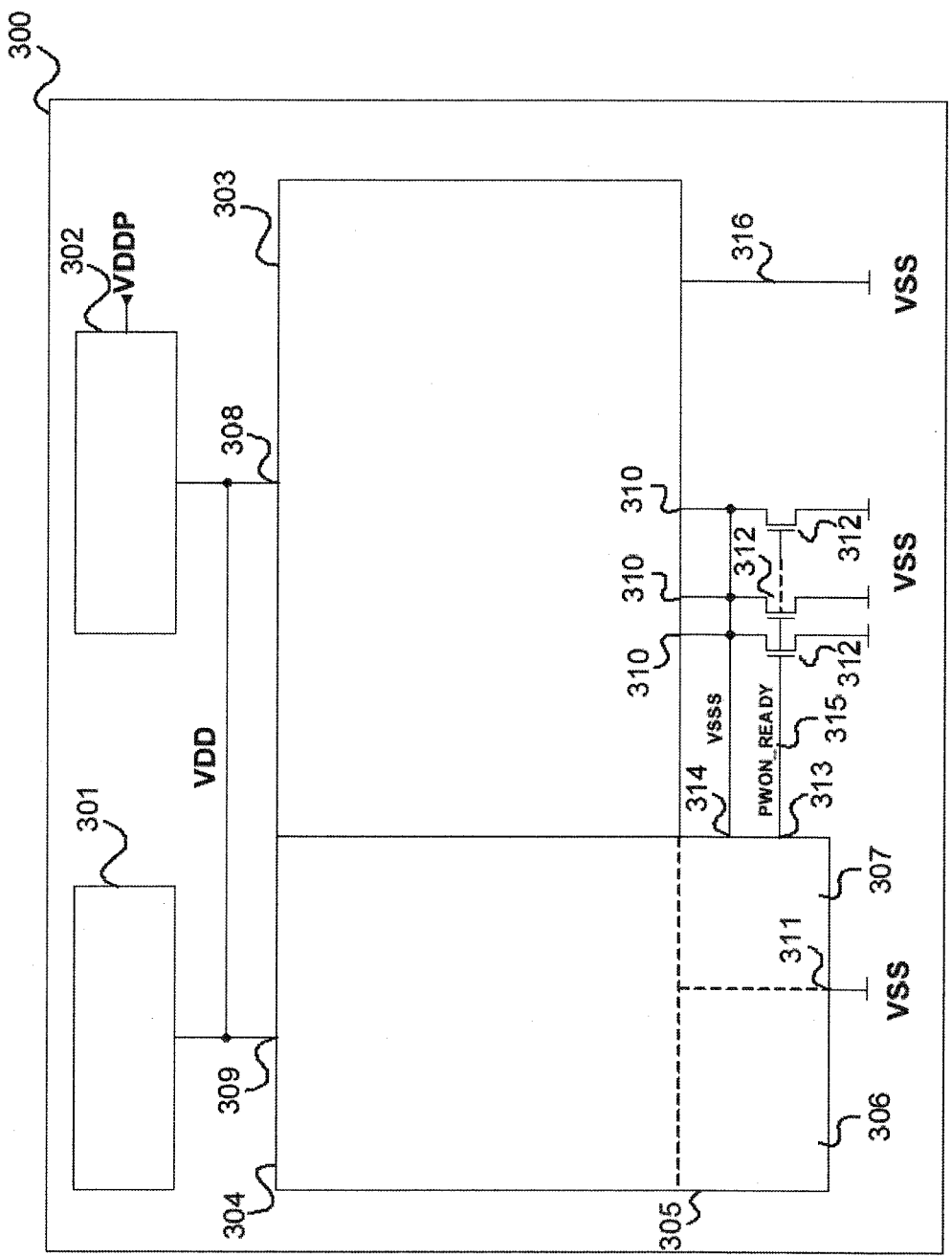
FIG. 3 shows an integrated circuit in accordance with one embodiment.

FIG. 3 shows an integrated circuit 300 in accordance with one embodiment.

In this example, the integrated circuit 300 is an integrated circuit of a so-called dual interface smart card and accordingly has a contactless (radio) interface 301 and a contact-based interface 302, which supply the supply potential VDD (i.e. the high supply potential).

The integrated circuit 300 includes a first circuit 303, which is turned off in an energy-saving state, and a second circuit 304, which is not turned off in the energy-saving state but rather is used, inter alia, for retaining stored data.

The first circuit 303 and the second circuit 304 respectively have a VDD terminal 308, 309 coupled to VDD. The first circuit 303 includes (one or in this example) a plurality of VSS terminals 310. Each VSS terminal 310 is coupled to the drain terminal of an n-channel transistor (e.g. of an NMOS (n-channel metal oxide semiconductor field effect transistor)) 312. The source terminals of the n-channel transistors 312 are coupled to VSS. The second circuit 304 includes one VSS terminal 311 coupled to VSS.

The first circuit includes, for example, memory circuits (e.g. ROMs (Read-Only Memories)), logic circuits and logic data paths, clock circuits, etc.

The second circuit includes, for example, memory circuits (e.g. RAMs (Random-Access Memories), registers, flip-flops) and components that are intended to be constantly turned on. The second circuit includes a control device 305 having a VSSS output 314, which is coupled to the VSS terminals 310 of the first circuit, and a PWON_READY output 313, which is coupled to the gates of the n-channel field effect transistors 312. By means of the VSSS output 314, the control device 305 can control the potential at the drain terminals of the n-channel field effect transistors 312, said output being designated by VSSS (stands for "VSS switchable"). By means of the PWON_READY output 313, the control device 305 can output a PWON_READY signal (stands for "power on ready", i.e. energy supply turned on), the high level of which turns on the n-channel field effect transistors 312, such that the VSS terminals 310 are coupled to VSS, and the low level of which turns off the n-channel field effect transistors 312, such that the VSS terminals 310 are decoupled from VSS. The control device 305 has a first control component 306, for example, which controls entry to the energy-saving mode (sleep mode) and leaving the energy-saving mode (i.e. the "wake-up") and supplies a PWON_READY signal 315 via the PWON_READY output 313, and a second control component 307, which sets VSSS by means of the VSSS output 314.

The first circuit 303 includes, for example, a plurality of n-channel field effect transistors (e.g. nMOS transistors), the source terminals of which are connected to the VSS terminals 310 of the first circuit 303. The substrate terminals (e.g. p-well terminals) of the n-channel field effect transistors are coupled to VSS, for example. The first circuit 303 furthermore includes, for example, a plurality of p-channel field effect transistors (e.g. pMOS transistors), the source terminals of which are coupled to the VDD terminal 308 of the first circuit 303. The substrate terminals (e.g. n-well terminals) of the p-channel field effect transistors are coupled to VDD, for example. By way of example, the first circuit is embodied using CMOS (Complementary Metal Oxide Semiconductor) technology. By way of example, all CMOS gates lying in the energy-saving region (i.e. in the circuit part that is turned off, i.e. in the first circuit 303) at the source regions of nMOS transistors are not connected to VSS, but rather to VSSS, while the p-well terminals or the p-substrate (pBulk) terminals of the nMOS transistors which the first circuit contains still remain connected to VSS, for example via a connection 316.

In this example, the turn-off of the first circuit 303 (Power Gating), i.e. the switchable disconnection of the first circuit 303 from the supply voltage, consists in disconnecting the first circuit 303 from the lower (low) supply potential VSS (e.g. ground). Analogously, however, a circuit can also be disconnected by means of a switchable upper (high) supply potential VDD or else both supply potentials VSS and VDD can be embodied as switchable, such that both supply potentials can be disconnected. Analogously to the n-channel transistors 312, by way of example, switches for disconnecting VDD from the first circuit could be provided and the level of one or a plurality of VDD terminals of the first circuit 303 could be controlled by means of a VDDS signal analogously to the VSSS signal 314, as described below.

The PWON_READY signal 313 (for driving the n-channel transistors 312, which illustratively serve as main switches between VSS and VSSS) and the potential VSSS, which can be regarded as a switchable ground potential, are supplied by the control device 305 (and in this case by the first control component 306 and respectively the second control component 307), that is to say a part of the second circuit 304 which can be regarded as a data retention region of the overall circuit and which is always (i.e. including in the energy-saving mode) connected to VDD and VSS.

The interplay of the first control component 306 and of the second control component 307 for generating PWON_READY and respectively for setting VSSS is described in greater detail below with reference to FIG. 4.

Figure 4:
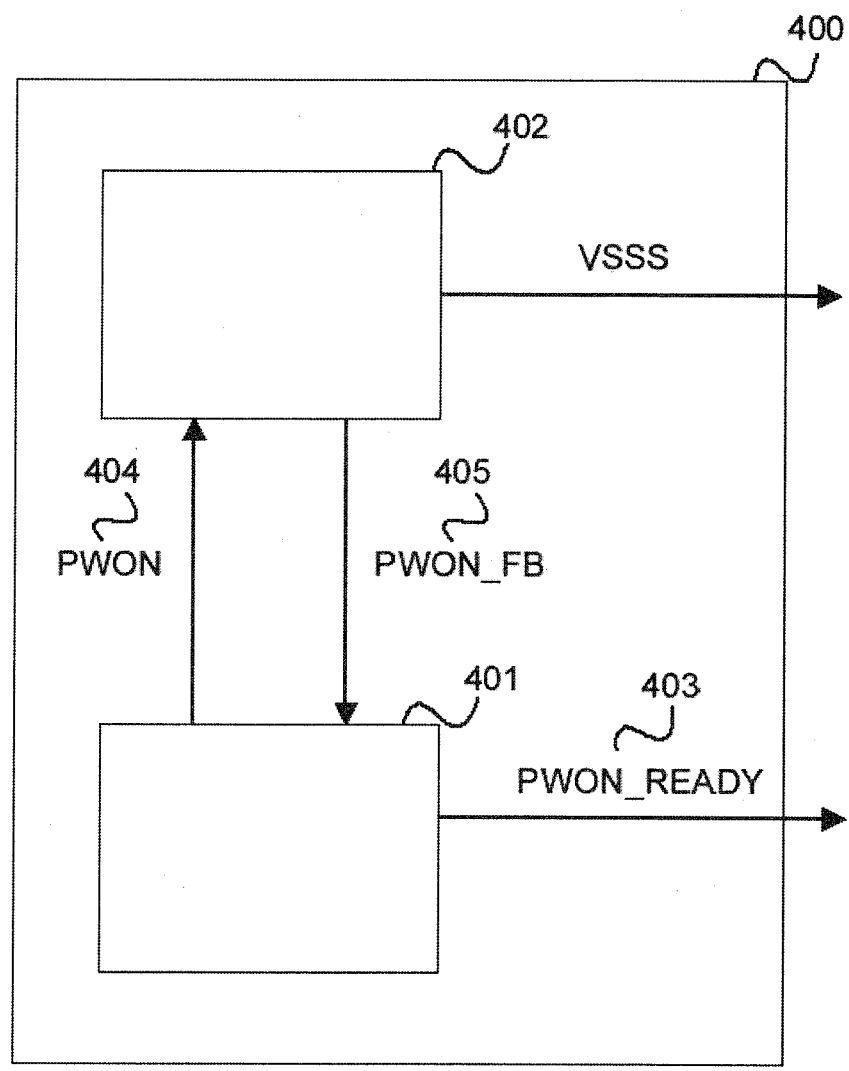
FIG. 4 shows a control device in accordance with one embodiment.

FIG. 4 shows a control device 400 in accordance with one embodiment.

The control device 400 corresponds to the control device 305, for example, and has a first control component 401, corresponding to the first control component 306, and a second control component 402, corresponding to the second control component 307.

The first control component 401 outputs a PWON_READY signal 403 corresponding to the PWON_READY signal 315, and the second control component 402 controls the potential VSSS. In addition, the first control component 401 supplies a PWON signal 404 to the second control component, and the second control component 402 supplies a PWON_FB (stands for "Power on Feedback") signal 405 to the first control component.

Figure 5:
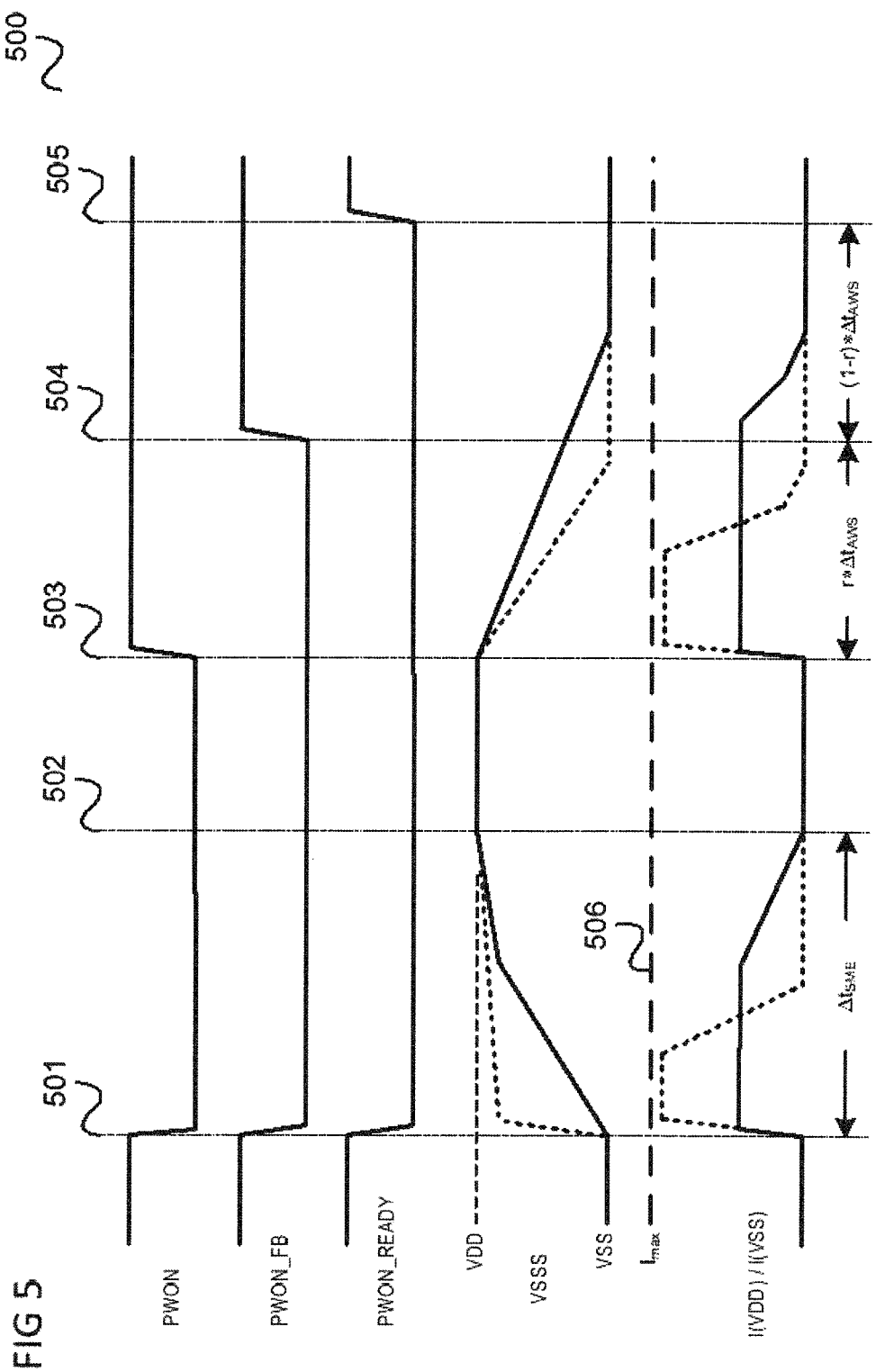
FIG. 5 shows a diagram with signal, potential and current profiles in accordance with one embodiment.

One example of a signal, potential and current profile during the turn-off and the renewed turn-on of the first circuit 303 is illustrated in FIG. 5.

FIG. 5 shows a diagram 500 with signal, potential and current profiles in accordance with one embodiment.

In the diagram 500, time runs from left to right. The illustration shows from top to bottom the profile of the PWON signal 404, of the PWON_FB signal 405, of the PWON_READY signal 403, of the potential VSSS and of the magnitude of the charging or discharging current of the VSS terminals 310 of the first circuit, wherein, for each signal, potential and respectively current profile, the respective values increase from the bottom upward.

The transition from the data processing mode to the energy-saving mode (e.g. data retention mode) occurs at a first instant 501 as a result of the deactivation of the PWON signal 404 by the first control component 401, i.e. the transition from PWON=1 to PWON=0. The second control component 402 reacts thereto promptly with the falling edge of the PWON_FB signal 405, which in turn results in the falling edge of the PWON_READY signal 403 by means of the first control component 401. At the same time as that, the second control component begins the charging of VSSS to VDD, to be precise, as illustrated in the charging current profile, in such a way that an (adjustable) maximum charging current $I_{max}$ 506 is not exceeded, wherein FIG. 5, with the solid and dashed temporal profiles of VSSS and the magnitude of the charging current I(VDD) and respectively of the discharging current I(VSS), shows by way of example the profiles for two different charging gradients or charging currents.

At a second instant 502 (after a time $\Delta t_{SME}$, where SME stands for "sleep mode entry"), VSSS is completely charged to VDD.

The transition from the energy-saving mode back to the data processing mode begins at a third instant 503 with the activation of the PWON signal on the part of the first control component 401, i.e. the transition from PWON=0 to PWON=1.

The second control component 402 reacts thereto in a delayed manner at a fourth instant 504 with the rising edge of the PWON_FB signal, wherein the delay between the third instant 503 and the fourth instant 504 is $r*\Delta t_{AWS}$, wherein 0<r<1 is dependent on the set maximum current with which VSSS is discharged from VDD to VSS.

In this case, the second control component 402 is designed such that the rising edge of the PWON_FB signal 405 occurs only after VSSS has fallen below a specific fraction of VDD-VSS, e.g. approximately 20% to 25% of VDD-VSS, and after VSSS has certainly reached the level of VSS after the elapsing of a further time interval $(1-r)*\Delta t_{AWS}$ (wherein AWS stands for wake-up sequence) at a fifth instant 505.

For this purpose, the first control component 401 can contain a counter circuit, which is started with the rising edge of the PWON signal 404 at a predefined start value, counts in a predefined direction up to the rising edge of the PWON_FB signal 405, and then counts backward again up to a predefined target value, upon the reaching of which (at the fifth instant 505) the first control component 401 generates the rising edge of the PWON_READY signal (for example r=½ results for the case where the counter counts backward again up to its start value). It can thus be ensured that the VSSS main switches (i.e. the n-channel field effect transistors 512) are closed only after VSSS has reached the level of VSS, such that no current spikes on account of, for instance, residual charge still present on VSSS can occur as a result of the closing of the main switches. Conversely, that means that the function of the main switches (e.g. exclusively) consists in keeping the level of VSSS sufficiently close to VSS during the data processing mode.

Figure 6:
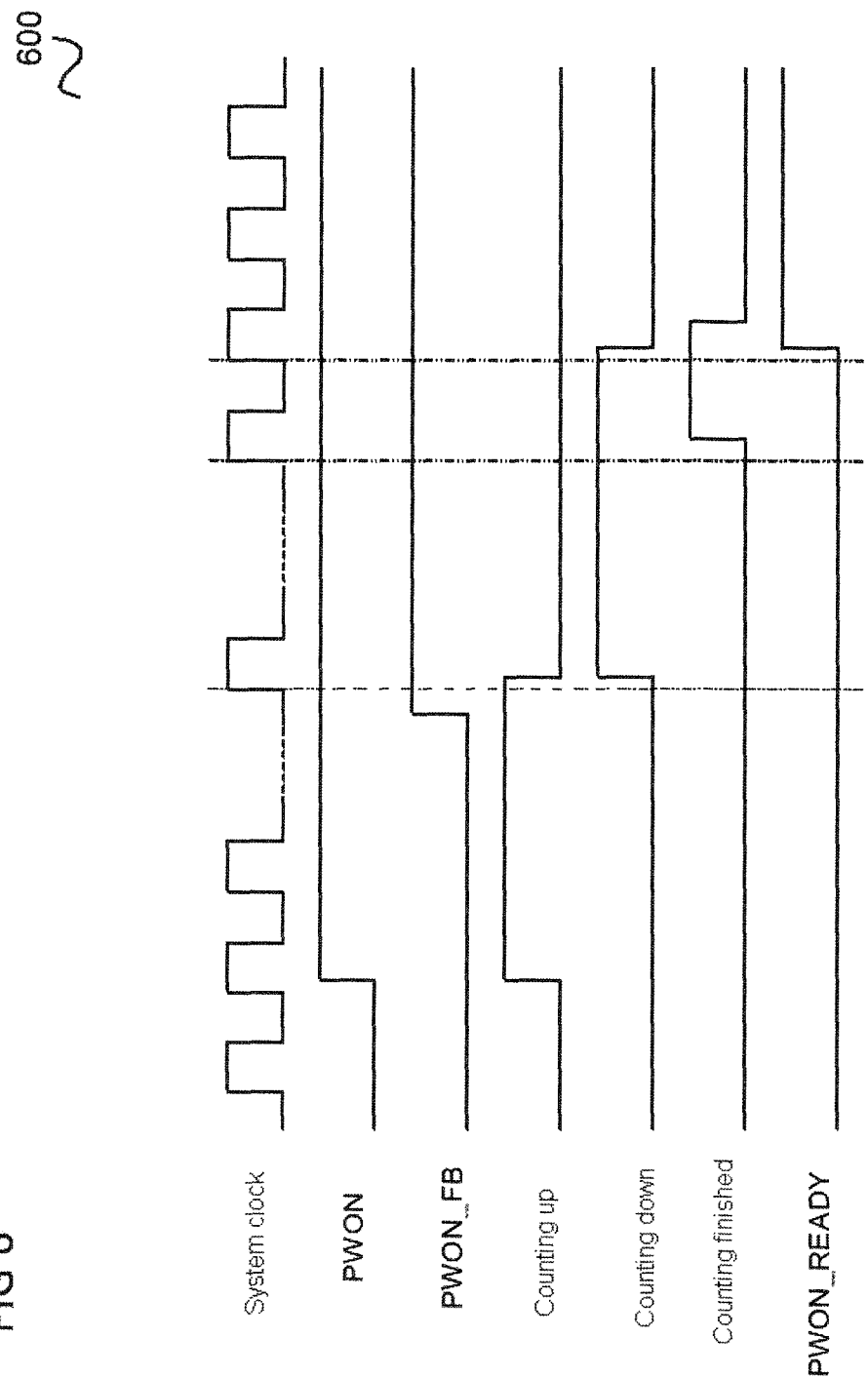
FIG. 6 shows a diagram with signal profiles in accordance with one embodiment.

The signal profile with the use of a counter is illustrated in FIG. 6.

FIG. 6 shows a diagram 600 with signal profiles in accordance with one embodiment.

Analogously to the diagram 500, time runs from left to right. The illustration shows from top to bottom the profile of the system clock used for example as a clock for the counter, of the PWON signal 404, of the PWON_FB signal 405, of a counting-up signal, the high level of which indicates that the counter is currently counting up, of a counting-down signal, the high level of which indicates that the counter is currently counting down, of a counting finished signal and of the PWON_READY signal 403.

The counting-up signal activates when the PWON signal 404 is activated. After the activation of the PWON_FB signal 405 (e.g. upon the next positive clock edge of the system clock), the counting-up signal is deactivated and the counting-down signal is activated.

For example if the counter has reached the count zero again, the counting finished signal is activated. In reaction thereto (e.g. upon the next positive clock edge of the system clock), the PWON_READY signal 403 is activated.

The counting-down signal and the counting finished signal are subsequently deactivated.

The circuit arrangement such as has been described on the basis of the example of the integrated circuit 300 and also the temporal behavior of the various signals described achieve the following:

(1) Upon transition from the data processing mode to the energy-saving mode, VSSS is charged as rapidly as possible (as rapidly as is possible for a predefined maximum charging current) from VSS to VDD, which results in a minimal quiescent current of the first circuit 303 since all nMOS transistors whose source regions are connected to VSSS now experience a maximum possible increase in their threshold voltage Vth on account of the substrate control effect. The quiescent current of the first circuit 303 thus results practically exclusively from the channel leakage current which flows via the main switches 312 and which makes up only a small fraction of the quiescent current which would flow without the measures described. Simply turning off the main switches 312, that is to say without charging VSSS actively and as rapidly as possible to VDD, would not suffice to ensure the function of the contactless system during a type A communication, since, during an interruption—lasting a few microseconds—in the energy supply via the radio interface 301, such as can occur during such a communication, an excessively high current would flow from VDD in the direction of VSSS via all possible current paths located in the first circuit 303, as a result of which VDD would fall below the level required for the correct function.

(2) The transition from the energy-saving mode back to the data processing mode occurs as rapidly as possible, i.e. VSSS is discharged from VDD to VSS as rapidly as is possible for a predefined maximum discharging current, it being ensured that VSSS has certainly reached the level of VSS at the instant when the VSSS main switches are turned on, such that no current spikes on account of, for instance, residual charge still present on VSSS occur as a result of the closing of the main switches.

(3) Parasitic capacitances located in the first circuit 303, primarily the nMOS source-bulk capacitances, are charged upon transition from the data processing mode to the energy-saving mode, such that the charge stored in them is available as buffer charge if the energy supply via the radio interface 301 is interrupted during a type A communication.

A rapid discharge of the VSSS potential from VDD to VSS, without exceeding a maximum current in the process, can be achieved for example by the provision of a plurality of pull-down stages in the second control component 402, which are activated successively, such that the total current always remains below the maximum current.

Figure 7:
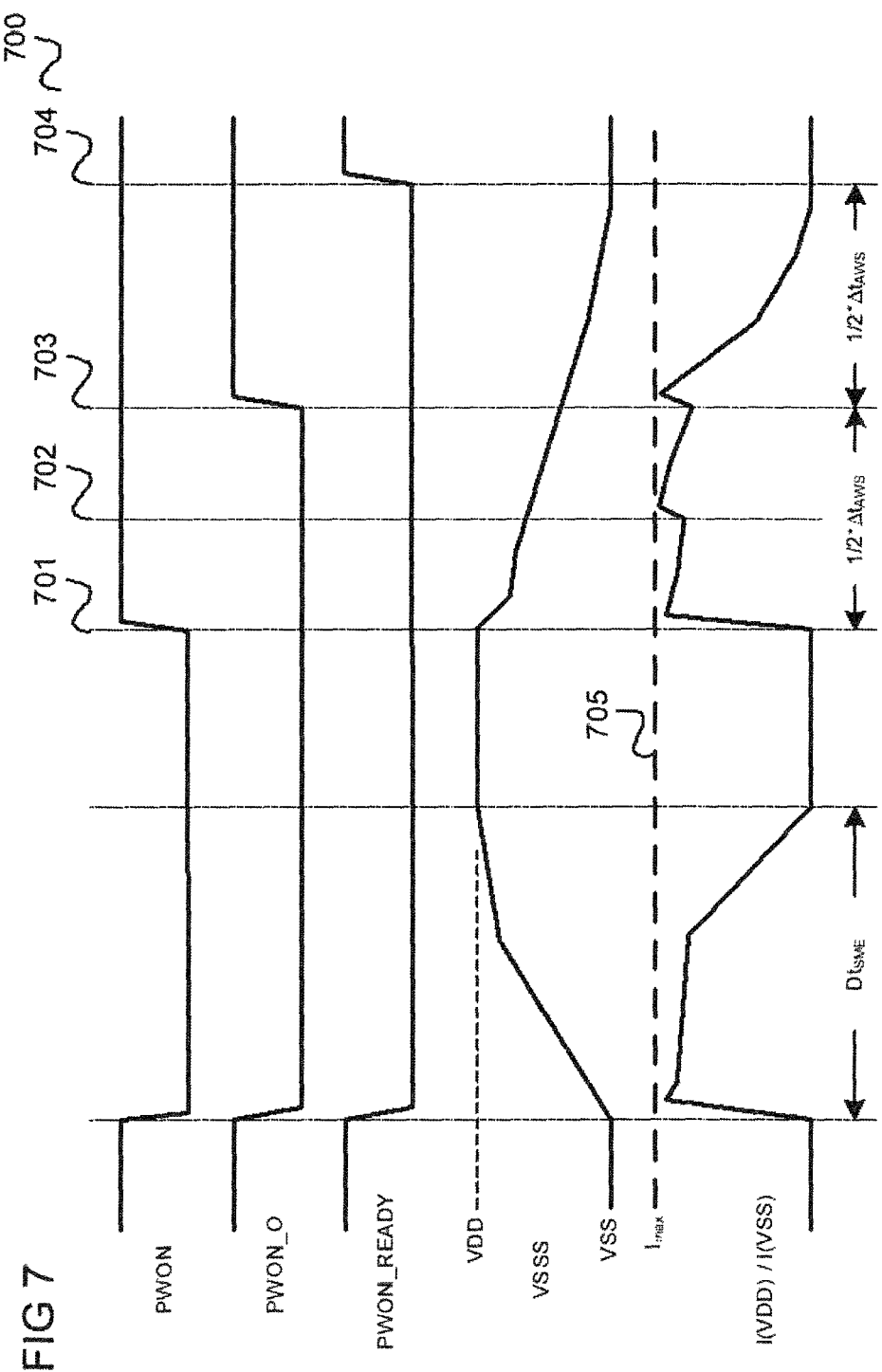
FIG. 7 shows a diagram with signal, potential and current profiles in accordance with one embodiment.

The current profile and VSSS potential profile for the case of three pull-down stages are illustrated in FIG. 7.

FIG. 7 shows a diagram 700 with signal, potential and current profiles in accordance with one embodiment.

Analogously to the diagram 500, in the diagram 700 time runs from left to right and the illustration shows from top to bottom the profile of the PWON signal 404, of the PWON_FB signal 405, of the PWON_READY signal 403, of the potential VSSS and of the magnitude of the charging or discharging current of the VSS terminals 310 of the first circuit, wherein, for each signal, potential and respectively current profile, the respective values increase from the bottom upward.

A description is given below only of the VSSS profile and of the profile of the discharging current (I(VSS)) between a first instant 701, corresponding to the third instant 503, and a fourth instant 704, corresponding to the fifth instant 505.

At the first instant 701, only a first pull-down stage of the second control component 402 is activated. At a second instant 702, a second pull-down stage of the second control component 402 is additionally activated. At a third instant 703, a third pull-down stage of the second control component 402 is additionally activated. Accordingly, what can be achieved is that the discharging current remains close to the maximum current $I_{max}$ 705 for a long period of time and does not exceed said maximum current. Consequently, the VSS terminals 310 of the first circuit 303 can be discharged rapidly and VSSS can be lowered to VSS rapidly, without exceeding the permissible maximum current.

The permissible maximum current used for discharging by the second control component can be set for example by means of two control signals, e.g. VSSS_F1 and VSSS_F0, for example in accordance with table 1.

TABLE 1

| VSSS_F1 | VSSS_F0 | Maximum discharging current |
|---|---|---|
| 0 | 0 | ~0.25 $I_{max}$ |
| 0 | 1 | ~0.50 $I_{max}$ |
| 1 | 0 | ~0.75 $I_{max}$ |
| 1 | 1 | ~1.00 $I_{max}$ |

Analogously, for example the permissible maximum current used for charging VSSS to VDD by the second control component can be set for example by means of two control signals, e.g. VDD_R1 and VDD_R0, for example in accordance with table 2.

TABLE 2

| VDD_R1 | VDD_R0 | Maximum charging current |
|---|---|---|
| 0 | 0 | ~0.25 $I_{max}$ |
| 0 | 1 | ~0.50 $I_{max}$ |
| 1 | 0 | ~0.75 $I_{max}$ |
| 1 | 1 | ~1.00 $I_{max}$ |

The control signals, e.g. VSSS_F1 and VSSS_F0, VDD_R1 and VDD_R0, have the consequence, for example, that the strength of the pull-down stages or pull-up stages can be varied, e.g. by means of switchable parallel circuits including nMOS transistors or pMOS transistors. This is illustrated in FIG. 8.

Figure 8:
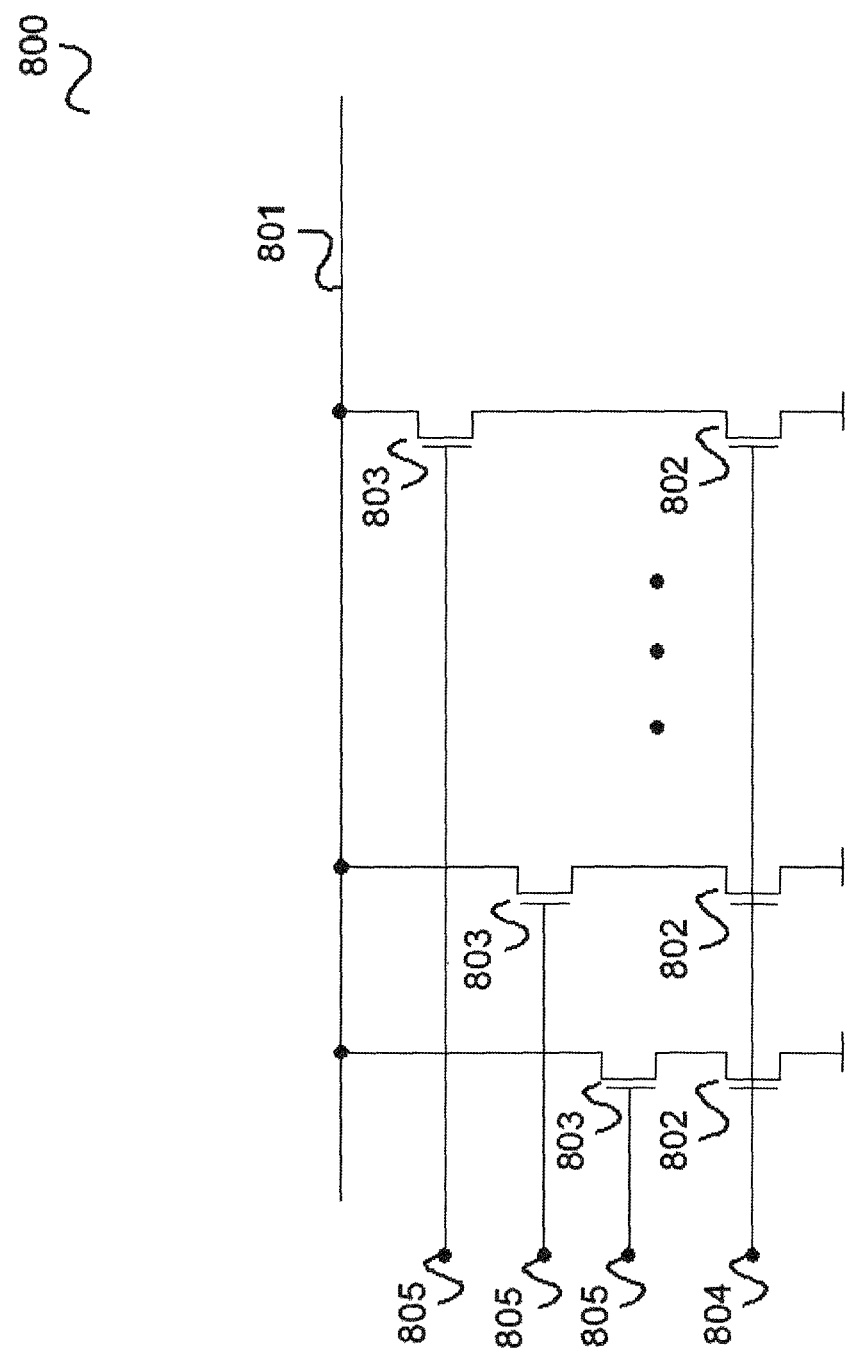
FIG. 8 shows a transistor arrangement in accordance with one embodiment.

FIG. 8 shows a transistor arrangement 800 in accordance with one embodiment.

In this example, the transistor arrangement 800 serves for discharging a node 801, i.e. forms a pull-down stage. Analogously, a transistor arrangement can be constructed for charging a node (i.e. as a pull-up stage).

The transistor arrangement 800 has first nMOS transistors 802, the source terminals of which are coupled to VSS. For each nMOS transistor 802, a second nMOS transistor 803 is provided, the source terminal of which is coupled to the drain terminal of the nMOS transistor. The drain terminals of the second nMOS transistors 802 are coupled to the node 801.

The gate terminals of the first nMOS transistors 802 are coupled to an input node 804, via which an activation signal can be fed in, which activates the transistor arrangement for discharging the node 801. By way of example, the input signal is the C_I signal if the transistor arrangement 800 is used instead of the first nMOS transistor 204.

Each first nMOS transistor 802 together with the second nMOS transistor 803 provided for it forms a branch which can be turned on or turned off by means of a corresponding level at a control input node 805 coupled to the gate terminal of the second nMOS transistor 803 (e.g. by means of one of the above-described signals VSSS_F1 and VSSS_F0 or VDD_R1 and VDD_R0 for a pull-up stage). In this way, it is possible to choose a specific number of branches which discharge the node 801 upon activation by the activation signal and a desired discharging current can thus be set.

By way of example, in the case of four identical branches, it is possible to select from four discharging currents.

By way of example, a decoder circuit can be provided for selecting the active branches.

Although the invention has been shown and described primarily with reference to specific embodiments, it should be understood by those familiar with the technical field that numerous modifications with regard to configuration and details thereof can be implemented, without departing from the essence and scope of the invention as defined by the following claims. Therefore, the scope of the invention is determined by the appended claims, and the intention is for all modifications to be encompassed which come under the literal meaning or fall within the scope of equivalence of the claims.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement comprising:
a circuit having a first terminal for a first supply potential and a second terminal for a second supply potential, wherein the first terminal is coupled to the first supply potential;
a switch, by means of which the second terminal can be coupled to the second supply potential;
a voltage source coupled to the second terminal; and
a control device designed to open the switch in reaction to receiving a turn-off signal in an operating mode in which the switch is closed, and subsequently to control the voltage source in such a way that it varies the potential of the second terminal in the direction of the first supply potential,
wherein the first supply potential is a high supply potential and the second supply potential is a low supply potential,
wherein the voltage source varies the potential of the second terminal in the direction of the first supply potential by feeding current to the second terminal current in addition to a total current which flows from the first supply potential through the circuit to the second terminal, and
wherein the control device controls the voltage source in such a way that the current fed to the second terminal by the voltage source does not exceed an adjustably set maximum value and so that a voltage of the voltage source is increased to a voltage of the first supply potential within a predefined period of time.

2. The circuit arrangement as claimed in claim 1, wherein the circuit has a plurality of n-channel field effect transistors, the source terminals of which are coupled to the second terminal.

3. The circuit arrangement as claimed in claim 2, wherein the substrate terminals of the n-channel field effect transistors are coupled to the second supply potential.

4. A circuit arrangement comprising:
a circuit having a first terminal for a first supply potential and a second terminal for a second supply potential, wherein the first terminal is coupled to the first supply potential;
a switch to selectively couple the second terminal to the second supply potential;
a voltage source coupled to the second terminal; and
a control device designed to open the switch in reaction to receiving a turn-off signal in an operating mode in which the switch is closed, and subsequently to control the voltage source in such a way that it varies the potential of the second terminal in the direction of the first supply potential,
wherein the first supply potential is a high supply potential and the second supply potential is a low supply potential,
wherein the voltage source varies the potential of the second terminal in the direction of the first supply potential by feeding current to the second terminal,
wherein the voltage source is designed to feed to the second terminal current which is greater than a total current which flows from the first supply potential through the circuit to the second terminal, and
wherein the control device controls the voltage source in such a way that the current fed to the second terminal by the voltage source does not exceed an adjustably set maximum value and so that a voltage of the voltage source is increased to a voltage of the first supply potential within a predefined period of time.

5. The circuit arrangement as claimed in claim 1, wherein the first supply potential is a low supply potential and the second supply potential is a high supply potential.

6. The circuit arrangement as claimed in claim 5, wherein the circuit has a plurality of p-channel field effect transistors, the source terminals of which are coupled to the second terminal.

7. The circuit arrangement as claimed in claim 6, wherein the substrate terminals of the p-channel field effect transistors are coupled to the second supply potential.

8. The circuit arrangement as claimed in claim 5, wherein the voltage source varies the potential of the second terminal in the direction of the first supply potential by carrying away current from the second terminal, and wherein the control device controls the voltage source in such a way that the current carried away from the second terminal by the voltage source does not exceed a predefined maximum value.

9. The circuit arrangement as claimed in claim 6, wherein the voltage source varies the potential of the second terminal in the direction of the first supply potential by carrying away from the second terminal current in addition to the total current which flows from the second terminal through the circuit to the first supply potential.

10. The circuit arrangement as claimed in claim 6, wherein the voltage source is designed to carry away from the second terminal current which is greater than the total current which flows from the second terminal through the circuit to the first supply potential.

11. The circuit arrangement as claimed in claim 1, wherein the circuit is a smart card circuit.

12. The circuit arrangement as claimed in claim 1, wherein the circuit implements a memory.

13. The circuit arrangement as claimed in claim 1, wherein the circuit implements an arithmetic unit.

14. The circuit arrangement as claimed in claim 1, wherein the control device is further designed, in reaction to receiving a turn-on signal in an operating mode in which the switch is open, to control the voltage source in such a way that it varies the potential of the second terminal in the direction of the second supply potential, and subsequently to close the switch.

15. The circuit arrangement as claimed in claim 4, wherein the control device is further designed, in reaction to receiving a turn-on signal in an operating mode in which the switch is open, to control the voltage source in such a way that it varies the potential of the second terminal in the direction of the second supply potential, and subsequently to close the switch.

* * * * *